(12) United States Patent
Buchoff et al.

(10) Patent No.: US 7,790,616 B2
(45) Date of Patent: Sep. 7, 2010

(54) ENCAPSULATED SILICIDATION FOR IMPROVED SIC PROCESSING AND DEVICE YIELD

(75) Inventors: Steven Mark Buchoff, Baltimore, MD (US); Andrew Christian Loyd, Monkton, MD (US); Robert S. Howell, Silver Spring, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 318 days.

(21) Appl. No.: 11/896,034

(22) Filed: Aug. 29, 2007

(65) Prior Publication Data

US 2009/0057906 A1 Mar. 5, 2009

(51) Int. Cl.
*H01L 21/44* (2006.01)
*H01L 23/532* (2006.01)

(52) U.S. Cl. ............... 438/682; 257/744; 257/E23.163; 257/E21.541

(58) Field of Classification Search ................ 438/682; 257/744, E23.163, E21.541
See application file for complete search history.

(56) References Cited

U.S. PATENT DOCUMENTS

| 5,409,853 A * | 4/1995 | Yu .............................. 438/300 |
| 6,759,683 B1 * | 7/2004 | Cole et al. .................... 257/77 |
| 2008/0311736 A1 * | 12/2008 | Mayer et al. ................ 438/602 |

* cited by examiner

*Primary Examiner*—Evan Pert
(74) *Attorney, Agent, or Firm*—Andrews Kurth LLP

(57) ABSTRACT

A method for producing a silicide contact. The method comprises the steps of depositing a metal on a SiC substrate; forming an encapsulating layer on deposited metal; and annealing said deposited metal to form a silicide contact. The encapsulating layer prevents agglomeration and formation of stringers during the annealing process.

19 Claims, 7 Drawing Sheets
(1 of 7 Drawing Sheet(s) Filed in Color)

ENCAPSULATED SILICIDATION FOR IMPROVED SIC PROCESSING AND DEVICE YIELD

TECHNICAL FIELD

The invention relates generally to semiconductor materials, and more particularly to methods for forming silicide contacts on a SiC substrate.

BACKGROUND OF THE INVENTION

Silicides are alloys of silicon and metals. Silicides combine the advantageous features of metal contacts (e.g significantly lower resistivity than poly-Si) and poly-Si contacts (e.g. no electromigration and the ability to withstand subsequent high temperature processes), and have been widely used in semiconductor devices. For example, forming silicide contacts in SiC devices, such as metal-oxide-semiconductor field-effect transistors (MOSFETs), static induction transistors (SITs), junction gate field-effect transistors (JFETs), metal-semiconductor field effect transistors (MESFETs), diodes, and bipolar junction transistors (BJTs), is an accepted method for reducing contact resistance and improving device performance.

Nickel silicide is the most common silicide used in SiC devices because of its low contact resistance to n+ material. However, nickel silicide is known to agglomerate during formation as well as produce stringers when formed on SiC. Agglomeration primarily occurs in large area contacts and degrades the contact resistance and possibly device reliability as well. Stringer formation can be even more problematic, as these stringers can cause shorting, particularly in structures with sub micron features. The tendency to form these stringers or agglomeration has not been well understood. FIG. 1 shows two examples of stringer formation, demonstrating that stringers can be rather small in some incidences, and very large and long in some other incidences, depending on the vagaries of the processing. The formation of stringers lead to difficulties in managing product yield when processing SiC devices.

Therefore, there still exists a need for methods of forming silicide contacts with reduced stringers.

SUMMARY OF THE INVENTION

One aspect of the present invention relates to a method for producing a silicide contact. The method comprises the step of depositing a metal on a SiC substrate; forming an encapsulating layer on deposited metal; and annealing said deposited metal to form a silicide contact. The encapsulating layer prevents agglomeration and formation of stringers during the annealing process.

In a preferred embodiment, the encapsulating layer has a coefficient of thermal expansion (CTE) that matches the CTE of the deposited metal.

Another aspect of the present invention relates to a silicide contact produced by the method of the present invention.

Yet another aspect of the present invention relates to an electronic device comprising a silicide contact produced by the method of the present invention.

DETAILED DESCRIPTION OF DRAWINGS

The patent or application file contains at least one drawing executed in color. Copies of this patent or patent application publication with color drawing(s) will be provided by the Office upon request and payment of the necessary fee.

Figure 4A:
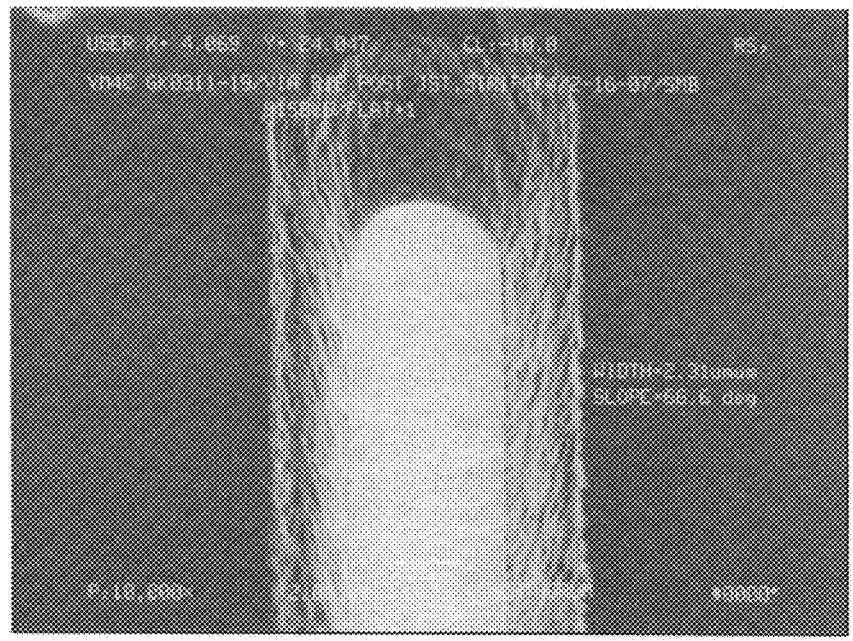
Figure 4B:
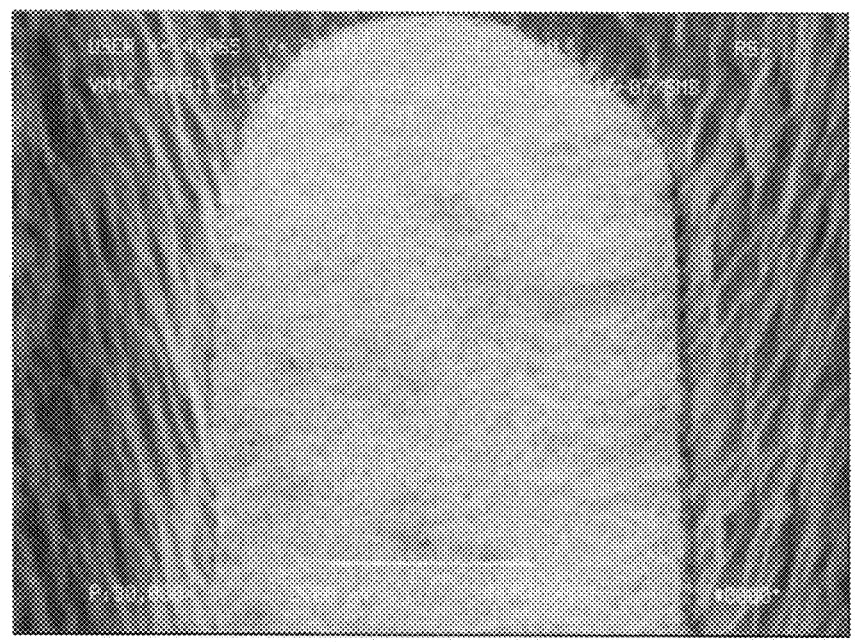

FIG. 4 is a composite of SEM images showing a titanium encapsulated nickel silicide after annealing and passivation. Panel A: 10,000×. Panel B: 30,000×.

Figure 5:
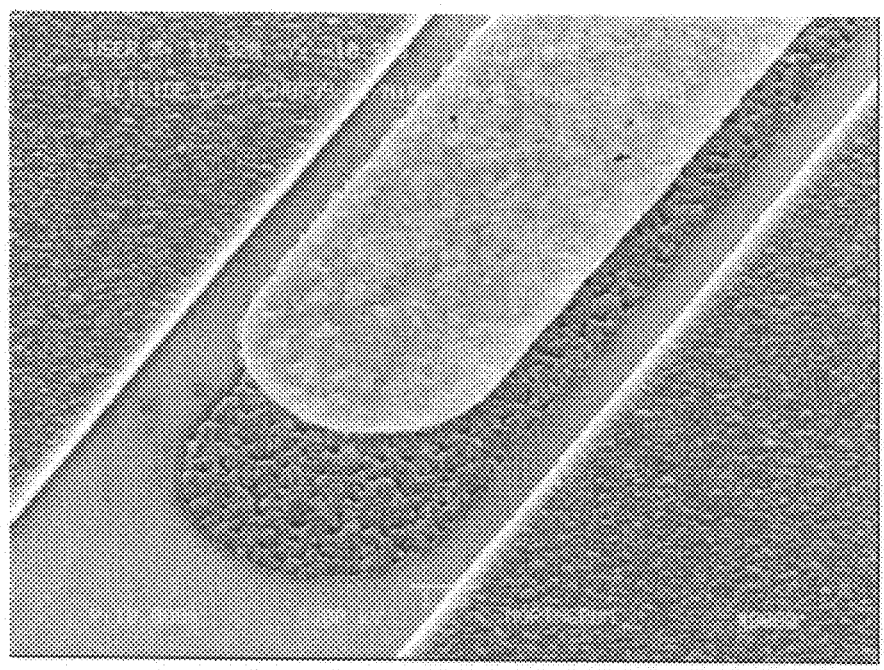

FIG. 5 is a SEM image showing delamination of a molybdenum encapsulating layer on nickel source silicide.

Figure 6:
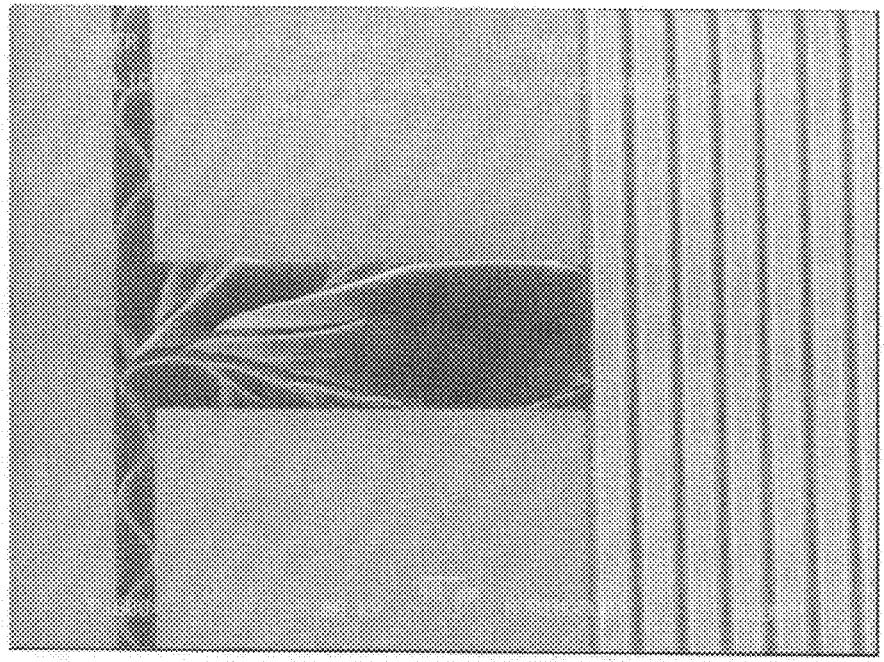

FIG. 6 is a SEM image showing cracking and delamination of a TEOS encapsulating layer on nickel source silicide.

Figure 7:
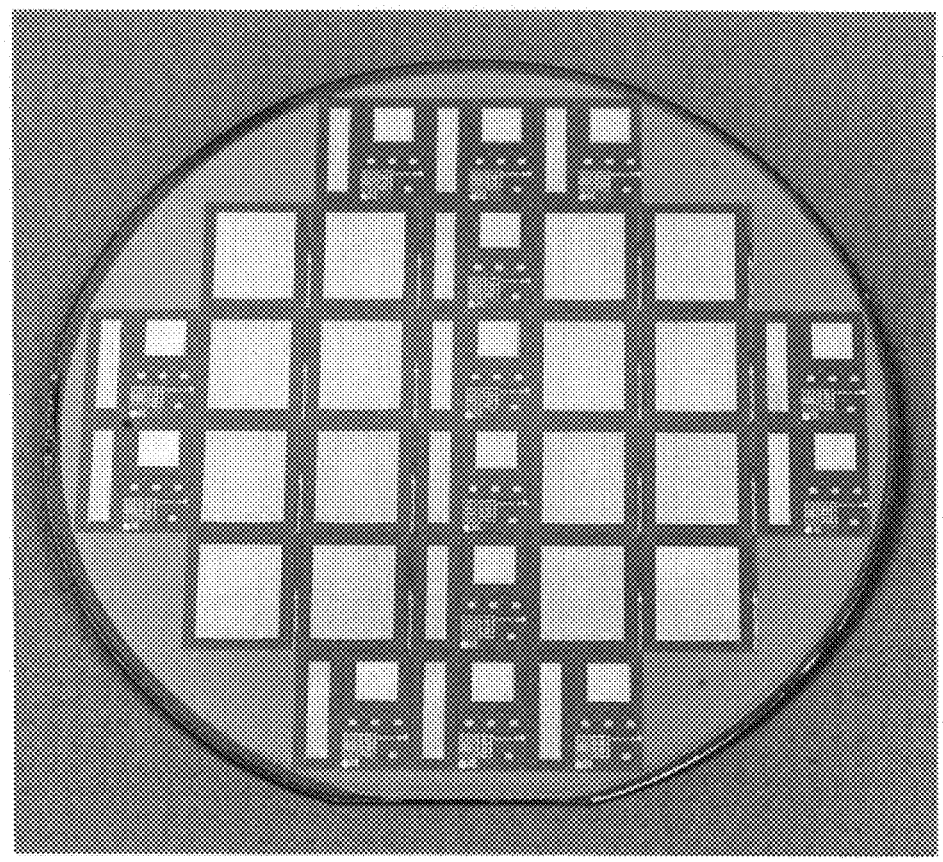

FIG. 7 is a picture of large area 10 kV SiC MOSFETs that use the titanium encapsulated nickel silicide contacts.

Figure 8:
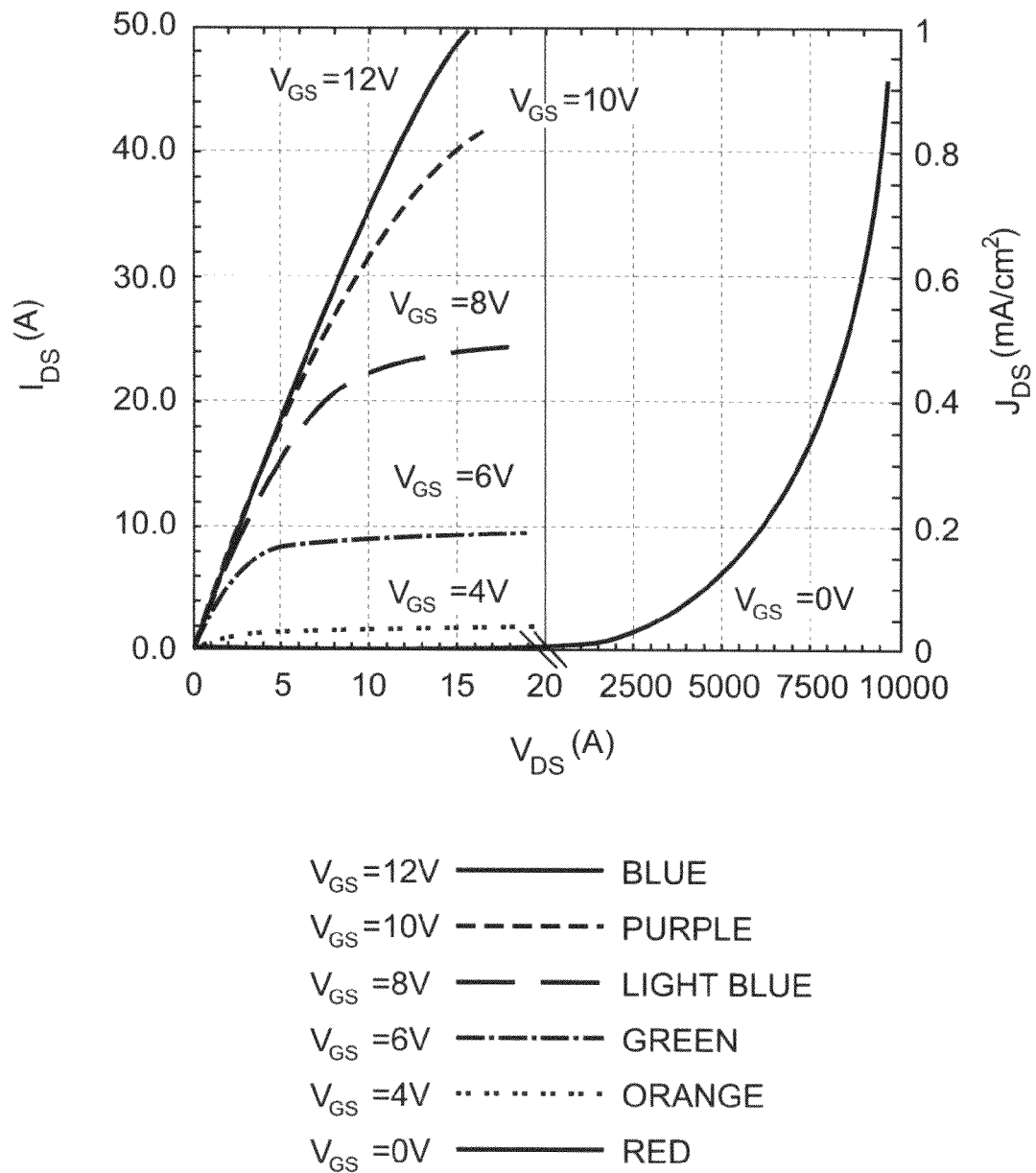

FIG. 8 is a plot showing the IV characteristics of a large (1 cm$^2$ chip area, 0.6 cm$^2$ active) device that used the titanium encapsulated nickel silicide contacts.

DETAILED DESCRIPTION OF THE INVENTION

Semiconductor devices, such as MOSFETs, SITs, JFETs, BJTs, generally contain a semiconductor substrate on which a number of transistors are formed. The particular stricture of a given transistor can vary between transistor types. For example, MOS transistors generally include source and drain regions and a gate electrode which modulates current between the source and drain regions. Bipolar transistors generally include a base, a collector, and an emitter. In addition to the active regions (e.g., source regions, drain regions, gate electrodes, bases, emitters, collectors, etc.) of the transistors, both bipolar and MOS transistors often include polysilicon lines, active regions which typically run over regions of the substrate, such as field oxide regions, and interconnect various portions of the region.

The various active regions on a semiconductor device are typically interconnected by metal lines. In most cases, a silicide is formed over some or all of the active regions in order to facilitate contact between the active regions and subsequent metal lines. The silicide areas also serve to reduce the sheet resistance of the active regions. Silicide areas are typically formed by depositing a layer of metal, such as nickel, over the substrate and annealing the wafer, typically in a two-step process. During the annealing process, the deposited metal reacts with underlying silicon and forms a metal silicidation layer.

Figure 1A:
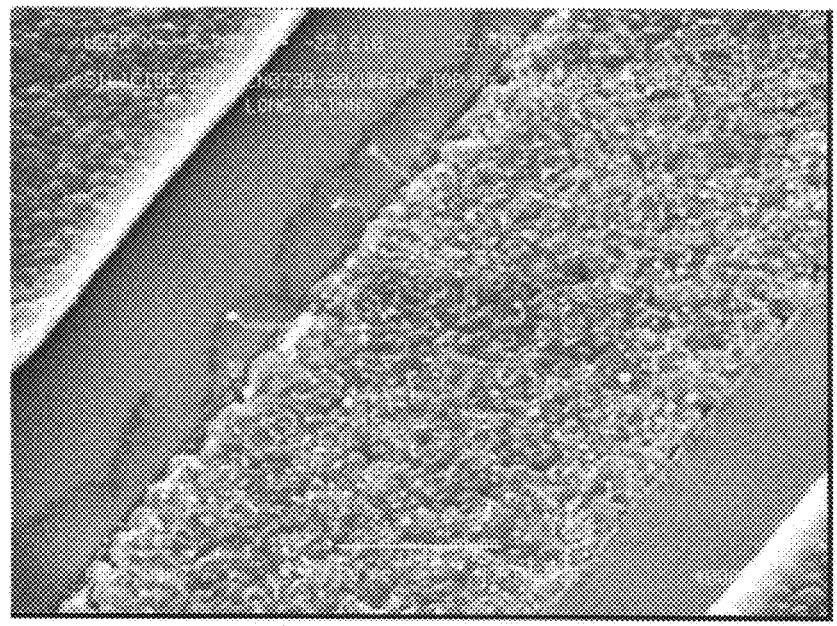
FIG. 1 is a composite of scan electron microscope (SEM) images showing the formation of small stringers (panel A) and large stringers (Panel B) in SiNi.
Figure 1B:
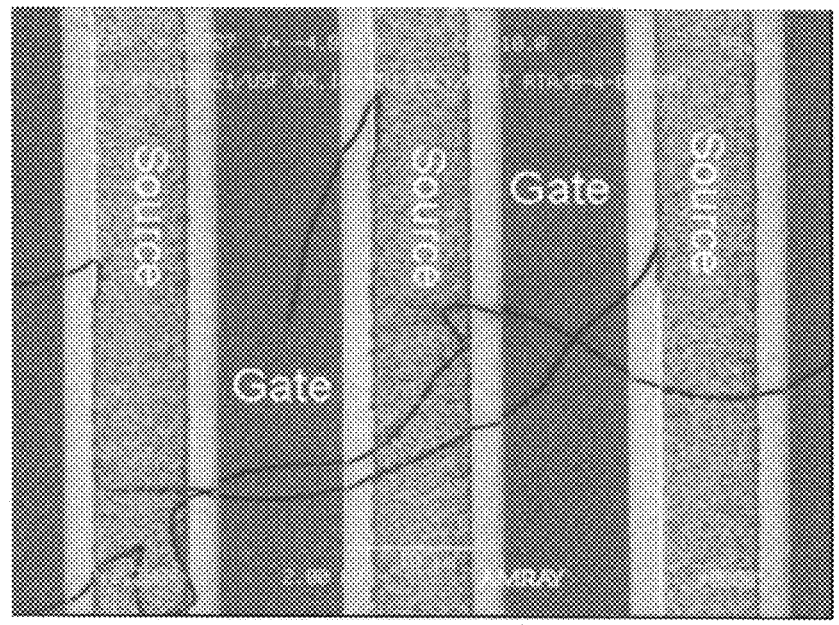
Figure 2:
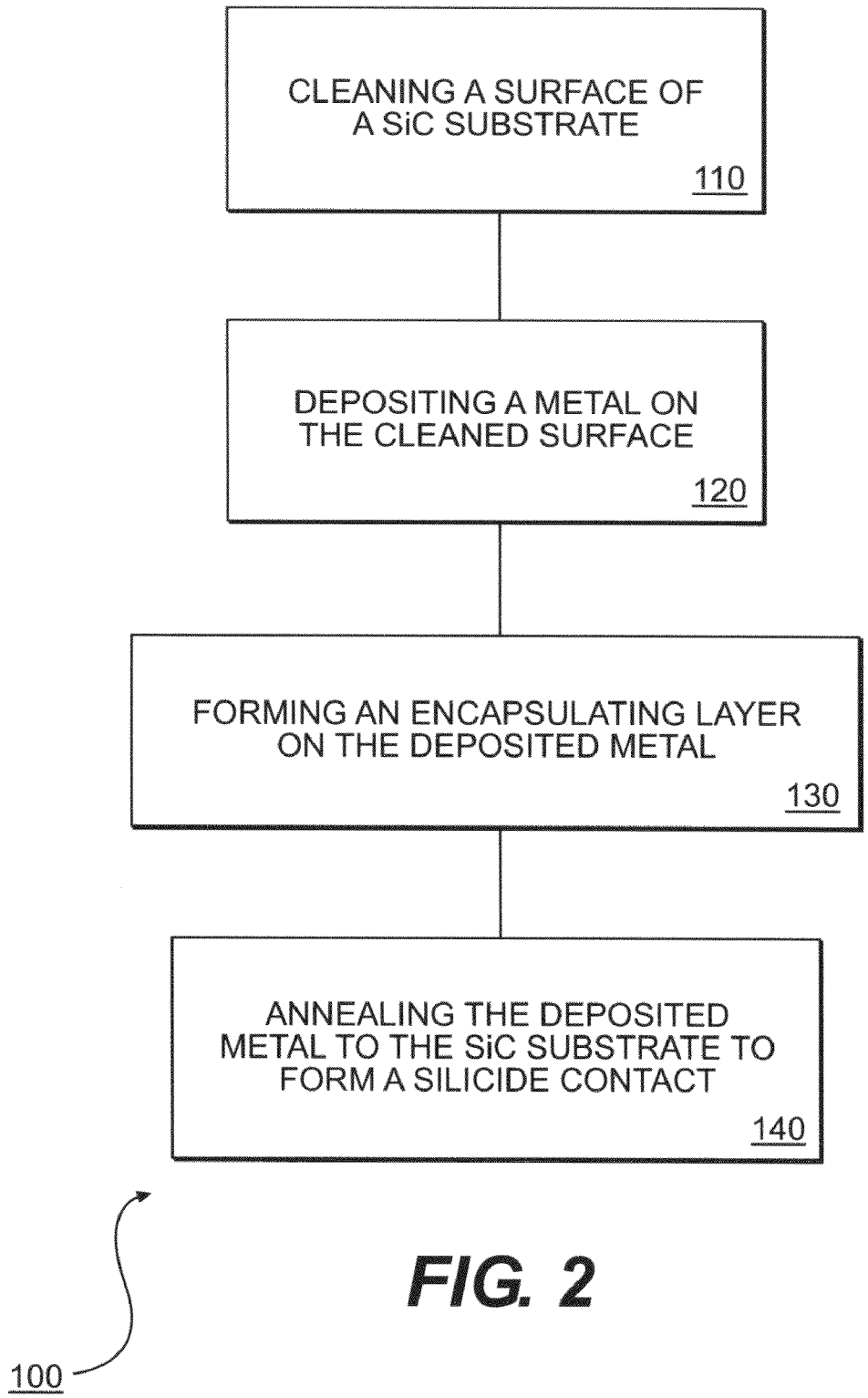
FIG. 2 is flow chart showing an embodiment of the method of the present invention.

Disclosed herein is a semiconductor fabrication method 100 that prevents the formation of silicide stringers when a silicide contact is formed on a semiconductive device. As shown in FIG. 2, the method 100 comprises the steps of cleaning (110) a surface of a SiC substrate, depositing (120) a metal on the cleaned surface, forming (130) an encapsulating layer on the deposited metal, and annealing (140) the deposited metal to SiC substrate to form a silicide contact.

Conventionally used silicides include, but are not limited to, NiSi, TiSi$_2$, CoSi$_2$, Ni(Pt)Si, and NiSiGe. A preferred silicide is nickel silicide since it has a low thermal budget possesses a lower resistivity than that of CoSi$_2$, and consumes less silicon.

The SiC substrate can be any SiC substrate, including but are not limited to, a single crystal SiC substrate, a polycrystalline SiC substrate, and a porous SiC substrate. The SiC substrates may be a n-doped or p-doped substrate. In one imbodiment, the SiC subsrtate is a hexagonal 4H-SiC substrate.

The cleaning step removes the native oxide on the SiC substrate. In one embodiment, the cleaning step further comprises the steps of etching the SiC substrate with 10% HF, washing the etched surface with dionized water followed by an organic solvent (e.g. isopropanol) to remove HF and retard further native oxide formation, followed by drying the washed surface with an inert gas to remove the organic solvent. Isopropanol is preferred because it does not leave a residue when dried from the surface, unlike organic solvents such as ethanol, methanol, and acetone. Examples of the inert gas include, but are not limited to, nitrogen.

The metal can be deposited on the SiC substrate using methods well known to one skilled in the art. In one embodiment, the metal is directly deposited on the SiC substrate by an evaporation procedure.

Evaporation procedures are well known to one skilled in the art. Briefly, the substrate is placed inside a vacuum chamber, in which the source material (i.e., the material to be deposited, such as the metal) is also located. The source material is then heated to the point where it starts to boil and evaporate. The vacuum is required to allow the molecules to evaporate freely in the chamber, and they subsequently condense on all surfaces. This principle is the same for all evaporation technologies, only the method used to the heat (evaporate) the source material differs. There are two popular evaporation technologies, which are e-beam evaporation and resistive evaporation each referring to the heating method. In e-beam evaporation, an electron beam is aimed at the source material causing local heating and evaporation. In resistive evaporation, a tungsten boat, containing the source material, is heated electrically with a high current to make the material evaporate. Many materials are restrictive in terms of what evaporation method can be used (i.e. aluminum is quite difficult to evaporate using resistive heating), which typically relates to the phase transition properties of that material. Other heating methods include radio-frequency and laser. Critical aspects of an evaporation process that will ensure the deposition of films with repeatable properties include: 1) the evaporation base pressure (<1 µTorr); 2) evaporation rates; 3) purity of the elements; and 4) residual gases present in the evaporation chamber.

In another embodiment, the metal is directly deposited on the SiC substrate by a sputtering procedure. Sputtering is a technology in which the material is released from the source at much lower temperature than evaporation. Sputtering procedures are also well known to one skilled in the art. Sputtering is basically a deposition process wherein atoms or molecules are ejected from a target material by high-energy particle bombardment so that the ejected atoms or molecules can condense on a substrate as a thin film. The substrate is placed in a vacuum chamber with the source material, named a target, and an inert gas (such as argon) is introduced at low pressure. A gas plasma is struck using an RF power source, causing the gas to become ionized. The ions are accelerated towards the surface of the target, causing atoms of the source material to break off from the target in vapor form and condense on all surfaces including the substrate. As for evaporation, the basic principle of sputtering is the same for all sputtering technologies. The differences typically relate to the manner in which the ion bombardment of the target is realized.

In another embodiment, a silicon layer is first deposited on the SiC substrate through an evaporation or sputtering procedure, and the metal is then deposited on the Si layer through an evaporation or sputtering procedure. In a preferred embodiment, the metal is nickel and is deposited directly on the cleaned surface of the SiC substrate by an evaporation procedure.

The encapsulating layer prevents stringer formation and agglomeration during the annealing process. In other words, the encapsulating layer is employed to 'seal' the deposited metal and keep it in place during the annealing process. A key characteristic of the encapsulating layer is that it has a coefficient of thermal expansion ($CTE_e$) that forms an appropriate match between the coefficient of thermal expansion of the deposited metal ($CTE_d$) and the CTE of the SiC substrate ($CTE_s$). The stringer formation and agglomeration that occurs during annealing is due in large part to the CTE mismatch between the deposited metal ($CTE_d$) and that of the substrate ($CTE_s$). The encapsulating layer needs to have a $CTE_e$ that is balanced between $CTE_d$ and $CTE_s$. A mismatch between $CTE_e$ and $CTE_d$ will lead to elastic deformation and high stress in the encapsulating layer, which will finally result in cracking and delamination of the encapsulating layer during the annealing step. Similarly, too great of a mismatch between $CTE_e$ and $CTE_s$ can force the encapsulating layer to have similar issues to the deposited metal that the encapsulation layer was intended to fix. Accordingly, the encapsulating layer should be composed of materials that would lead to a $CTE_e$ that is in the middle region between the $CTE_d$ and the $CTE_s$ as possible to balance these competing issues. Table 1 lists the CTEs of commonly used materials in semiconductor devices.

TABLE 1

| CTEs of commonly used materials in semiconductor devices | |
|---|---|
| Material | CTE (ppm/° C.) |
| Ni | 13.3 |
| Pd | 11.0 |
| Pt | 9.0 |
| Ti | 8.9 |
| Ir | 6.8 |
| Ta | 6.5 |
| Mo | 5.1 |
| W | 4.5 |
| 4H—SiC | 3.7 |
| SiO$_2$ | 0.5 |

The encapsulating layer may comprise a metal, an alloy, or a deposited insulator, such as a silicon dioxide layer formed from a CVD deposition using tetra-ethoxy-silane (TEOS). The encapsulating layer may be formed by a vapor deposition or sputtering process well known to one skilled in the art.

In one embodiment, the deposited metal is nickel and the encapsulating layer comprises titanium. Typically, the encapsulating layer has a thickness of 2-250 nm, and preferably 20 nm.

During the annealing process, the deposited metal is exposed to high temperatures (e.g. 700-1200° C.) that promote the chemical reactions between the metal and the silicon in the SiC needed to form the silicide. In such a metallurgical reaction, metal-rich silicides generally form first, and continue to grow until all the metal is consumed. When the metal has been consumed, silicides of lower metal content start appearing, which can continue to grow simply by consuming the metal-rich silicides. Silicide formation by direct metallurgical reaction also consumes silicon from the SiC substrate onto which the metal was placed. The annealing temperature and duration may vary depending on the metal component(s) of the silicide, and are well known to one skilled in the art.

Another aspect of the present invention relates to a silicide contact produced using the method of the present invention.

Yet another aspect of the present invention relates to electronic devices, such as MOSFETs, that comprise a silicide contact produced using the method of the present invention.

EXAMPLES

Example 1

Encapsulating Nickel Deposit with a Titanium Layer Prevents Stringer Formation and Agglomeration During Nickel Silicide Formation A SiC wafer was etched in 10% HF to remove any native oxide on the wafer surface. The etched SiC wafer was washed with isopropanol and dried with nitrogen gas and immediately loaded into the growth chamber of an e-beam evaporation device (e.g. CHA E-Beam Evaporation System (CHA Industries, Fremont, Calif.), pumped down to <1 µTorr). Nickel was deposited on the SiC using the standard e-beam deposition procedure setting the e-beam evaporator to a 10 A/minute deposition rate. A titanium layer was then also formed on the deposited nickel by e-beam deposition. The deposited layers then underwent rapid-thermal annealing in Ar at 900° C. for 30 seconds, and 980° C. for 60 seconds using an Axcelis Reliance 850 RTA system (Axcelis Technologies Inc., Beverly, Mass.).

Figure 3:
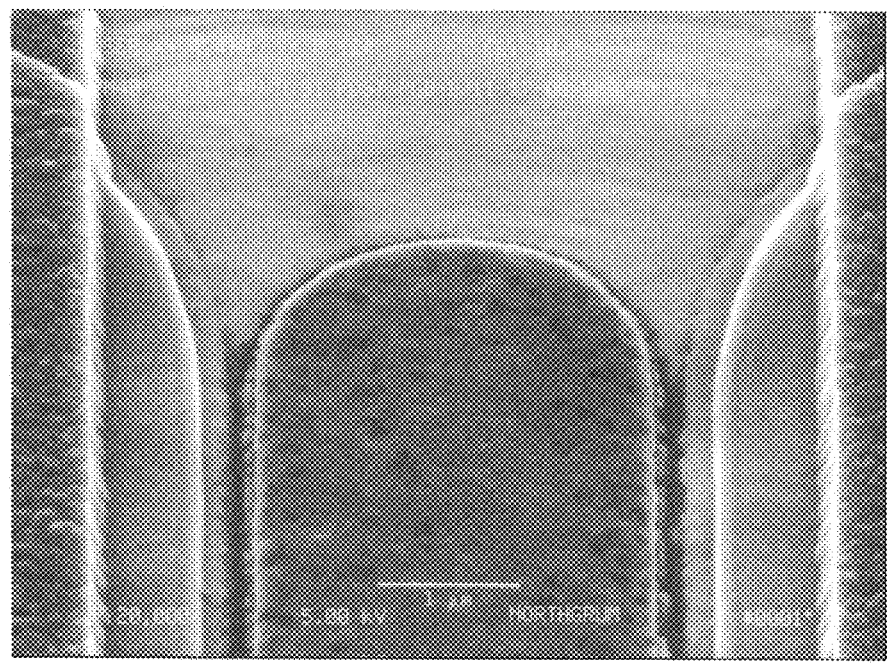
FIG. 3 is a SEM image showing nickel silicidation on SiC using a titanium encapsulating layer.

Titanium was selected as the encapsulating layer because it adheres well to the nickel deposit and prevents the stringer formation and agglomeration. The titanium layer requires no additional processing to remove after nickel silicidation. Moreover, the titanium layer apparently also reacts during the nickel silicide formation, and helps to form the resulting contact. Thus the titanium encapsulating step can be incorporated into existing Ni—SiC silicidation processing with a minimum of additional processing effort. FIG. 3 is a scan electron microscope image of nickel silicidation with a titanium encapsulating layer, showing the smoother surface of silicide (no agglomeration) and absence of any stringer formation.

FIG. 4 is another scan electron microscope image showing a titanium encapsulated nickel silicide after annealing and passivation. The microscope was scanning the titanium/nickel interface through a via in the oxide passivation covering the surface of the silicide contact.

Example 2

Molybdenum or Tetra-ethoxy-silane (TEOS) Deposited Oxide Layer on Nickel Deposit Suffered Cracking and/or Delamination During Silicidation Annealing Process A SiC wafer was etched in 10% HF to remove any native oxide. The etched SiC wafer was washed with isopropanol and dried with nitrogen gas and immediately loaded into the growth chamber of an e-beam evaporation device (e.g. CHA E-Beam Evaporation System, pumped down to <1 µTorr). Nickel was deposited on the SiC using the standard e-beam deposition procedure, setting the e-beam evaporator to a 10 A/minute deposition rate. A molybdenum layer was then formed on the deposited nickel also by e-beam deposition. The deposited layers then under went rapid-thermal annealing in Ar at 900° C. for 30 seconds, and 980° C. for 60 seconds using an Axcelis Reliance 850 RTA system. As shown in FIG. 5, the molybdenum encapsulating layer was delaminated after the annealing process.

In another experiment, a TEOS silicon dioxide layer was deposited on the nickel deposition, using an AMAT P5000 CVD system (Applied Materials, Inc., Santa Clara, Calif.). Similar to the molybdenum encapsulating layer, the TEOS oxide layer developed delamination and cracking after the annealing step (FIG. 6).

These results suggest that care must be taken in choosing an appropriate encapsulating layer for a particular metal deposit. The encapsulating layer should have a CTE that balances between the CTE of the deposited metal and the substrate. The CTE of Ni is 13.3 ppm/C, compared to 8.9 for Ti, 5.1 for Mo, 0.5 for SiO2 and 3.7 for 4H—SiC. Of these, only Titanium worked satisfactorily because its CTE was sufficiently close to that of Ni. The use of other metals, such as Pd (CTE=11 ppm/° C.), Pt (CTE=9 ppm/° C.), and Ir (CTE=8.9 ppm/° C.), as well as other alloys with the appropriate combination of hardness and CTE match could be used as this encapsulating layer.

Example 3

Devices Produced Using Titanium Encapsulated Nickel Silicide Contacts

Several MOSFET devices were created using titanium encapsulated nickel silicide contacts. Besides the encapsulating step, the processes used to create the devices were all standard MOSFET fabrication processes well known to one skilled in the art. The processing of these MOSFETs used a planar double implantation DMOSFET vertical structure and process sequence typical of such high voltage SiC devices. FIG. 7 shows a picture of large area 10 kV SiC MOSFETs that use the titanium encapsulated nickel silicide contacts.

Electrical testing on the MOSFETs was performed using a micromanipulator probe set up with a Tektronix 371A High Power Curve Tracer for the forward (on) characteristics and a Trek Model 20/20C High Voltage Amplifier with the device immersed in flouinert to measure the reverse (OFF) characteristics.

FIG. 8 is a plot showing the IV characteristics of a large (1 cm$^2$ chip area, 0.6 cm$^2$ active) device that used the titanium encapsulated nickel silicide contacts. This plot shows that the device can source 50A of current in the forward direction, and blocks 10 kV in the reverse direction, a record amount of power for a single MOSFET chip.

Although the disclosure and claims make reference to particular means, materials and embodiments, it is to be understood that the claims are not limited to these disclosed particulars, but extend to all equivalents.

What is claimed is:

1. A method for producing a silicide contact, comprising:
   depositing a metal on a SiC substrate;
   forming an encapsulating layer on the deposited metal; and
   annealing said deposited metal to form a silicide contacts,
   wherein the forming forms said encapsulating layer so that said encapsulating layer has direct contact to the deposited metal and has a coefficient of thermal expansion that is balanced between the coefficient of thermal expansion of said deposited metal and the coefficient of thermal expansion of the SiC substrate.

2. The method of claim 1, wherein said SiC substrate is subjected to a cleaning process prior to the depositing step.

3. The method of claim 2, wherein said cleaning process comprises the step of
   etching said SiC substrate with hydrofluoric acid.

4. The method of claim 3, wherein said cleaning process further comprises the steps of:

washing the etched SiC substrate with an organic solvent selected from the group consisting of methanol, ethanol, propanol, isopropanol, and acetone; and drying the SiC substrate.

5. The method of claim 4, wherein said organic solvent is isopropanol.

6. The method of claim 1, wherein said metal is deposited on said SiC substrate by an evaporation or sputtering deposition process.

7. The method of claim 6, wherein said metal is deposited on said SiC substrate by electron beam evaporation.

8. The method of claim 1, wherein said encapsulating layer comprises a metal or an alloy.

9. The method of claim 1, wherein said encapsulating layer is formed by an evaporation or sputtering deposition process.

10. The method of claim 1, wherein said metal is nickel.

11. The method of claim 10, wherein said encapsulating layer comprises titanium.

12. The method of claim 11, wherein said encapsulating layer is formed by electron beam deposition.

13. The method of claim 12, wherein said annealing step is performed in argon at a temperature in the range of 700-1200° C.

14. The method of claim 13, wherein said annealing step is performed in argon at 900° C. for about 30 seconds and 980° C. for about 60 seconds.

15. The method of claim 1, wherein said encapsulating layer has a thickness in the range of 2-250 nm.

16. The method of claim 15, wherein said encapsulating layer has a thickness of about 20 nm.

17. A silicide contact produced by the method of claim 1.

18. A silicide contact produced by the method of claim 1, wherein said metal is nickel and said encapsulating layer comprises titanium.

19. An electronic device comprising a silicide contact produced by the method of claim 1.

* * * * *